United States Patent [19]

Dennard et al.

[11] Patent Number: 5,462,883
[45] Date of Patent: Oct. 31, 1995

[54] METHOD OF FABRICATING DEFECT-FREE SILICON ON AN INSULATING SUBSTRATE

[75] Inventors: Robert H. Dennard, Peekskill; Bernard S. Meyerson, Yorktown Heights; Robert Rosenberg, Peekskill, all of N.Y.

[73] Assignee: International Business Machines Corporation, Armonk, N.Y.

[21] Appl. No.: 225,499

[22] Filed: Apr. 11, 1994

Related U.S. Application Data

[63] Continuation of Ser. No. 723,091, Jun. 19, 1991, abandoned.

[51] Int. Cl.$^6$ .................................................. H01L 21/265
[52] U.S. Cl. ........................... 437/21; 437/84; 437/86; 437/131
[58] Field of Search ........................... 437/84, 86, 131, 437/21

[56] References Cited

U.S. PATENT DOCUMENTS

| | | | |
|---|---|---|---|
| 3,293,087 | 12/1966 | Porter. | |
| 3,455,748 | 7/1969 | Lindmayer et al. | |
| 4,000,020 | 12/1976 | Gartman. | |
| 4,351,856 | 9/1982 | Matsui et al. | |
| 4,534,804 | 8/1985 | Cade | 437/19 |
| 4,601,779 | 7/1986 | Abernathey et al. | |
| 4,861,393 | 8/1989 | Bean et al. | |
| 5,013,681 | 5/1991 | Godbey et al. | 437/62 |
| 5,261,999 | 11/1993 | Pinker et al. | 437/86 |

OTHER PUBLICATIONS

Palik et al "Ellipsometric study of the Etch–stop mechanism in Heavily Doped silicon" Jr. Electrochem. Soc 132 (1985), 135–141.

Maszara, W. P., et al., "Bonding on silicon wafers for silicon–on–insulator" J. Appl. Phys. 64(10), 15 Nov. 1988, pp. 4943–4946.

Herzog, H. J., et al., "X–Ray Investigation of Boron– and Germanium–Doped Silicon Epitaxial Layers", J. Electrochem. Soc.: Solid–State Science and Technology, Dec. 1984, pp. 2969–2974.

Hirayama, Hiroyuki, et al., "Stress reduction and doping efficiency and B– and Ge–doped silicon molecular beam epitaxy films.", Appl. Phys. Lett. 52(16), 18 Apr. 1988, pp. 1335–1337.

Sze, S. M., VLSI Technology, pp. 85–89 (2d ed. 1988).

Meyerson, B. S., et al., "Nonequilibrium Boron Doping Effects in Low–Temperature Epitaxial Silicon Films", *Appl. Phys. Lett.*, 50(2):113 (1987).

Lasky, J. B., et al., "Silicon–On–Insulator (SOI) By Bonding and Etch–Back", *IEDM Technical Digest*, 684 (1985).

*Primary Examiner*—R. Bruce Breneman
*Assistant Examiner*—Ramamohan Rao Paladugu
*Attorney, Agent, or Firm*—Scully, Scott, Murphy & Presser

[57] ABSTRACT

A method for fabricating silicon on insulator structures having a dislocation free silicon layer. The method utilizes low temperature UHVCVD to deposit a very heavily doped etch stop layer having a very steep doping profile onto a substrate and a lightly doped active layer onto the etch stop layer. An insulator is formed on the active layer and a carrier wafer is formed on the insulator layer. The original substrate is removed in a first etch and the etch stop layer is removed in a second etch resulting in a thin, uniform active layer. In one embodiment, a small percentage of germanium is added to the etch stop layer to produce a defect free epitaxial active layer.

32 Claims, 1 Drawing Sheet

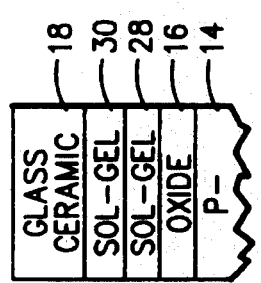
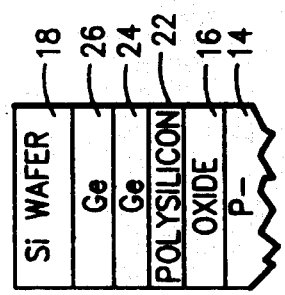
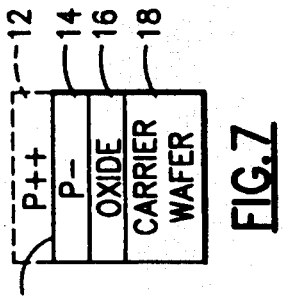
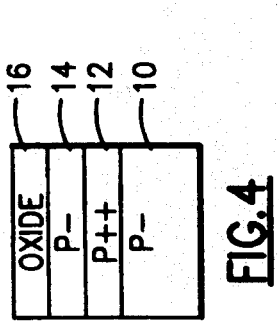
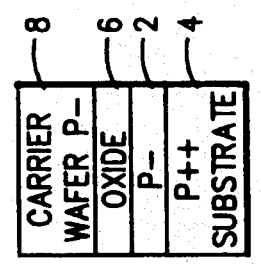
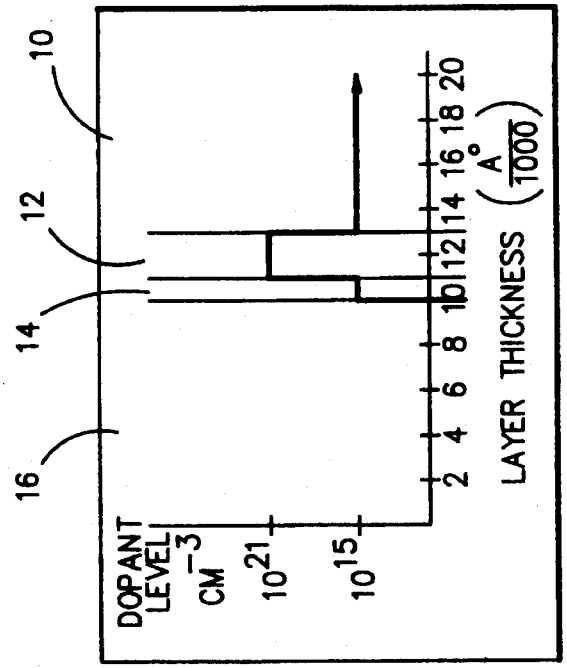
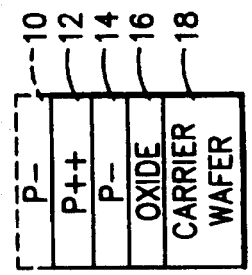

1

METHOD OF FABRICATING DEFECT-FREE SILICON ON AN INSULATING SUBSTRATE

This is a continuation of application Ser. No. 723,091, filed on Jun. 28, 1991, now abandoned.

BACKGROUND OF THE INVENTION

1. Field of the Invention

The present invention relates to silicon on insulator structures and more particularly to a method for fabricating such structures with a defect free silicon active area.

2. Description of the Prior Art

Those skilled in the art have long recognized the desirability of silicon-on-insulator structures for fabricating semiconductor devices. The resulting circuit and device isolation can eliminate latchup problems and reduce soft errors from alpha particles (or other ionizing radiation) while reducing intrinsic and parasitic capacitance. During the past several years, there has been an increase in efforts to improve the electronic quality of silicon on insulator (SOI) structures for VLSI applications. One method of fabricating such a device comprises forming a silicon layer above an existing oxide layer. Examples are laser or strip heater recrystallization and selective epitaxial methods. Generally, the quality of the silicon layer is inferior to that normally associated with silicon processing. A second technique in fabricating SOI structures comprises forming an oxide layer beneath an existing high quality silicon layer. Examples are oxidized porous silicon and oxygen ion implantation. Generally these methods result in an inferior oxide and the quality of the SOI may be degraded during oxide formation.

Another technique for forming silicon on insulator structures is disclosed by Lasky et al. IEDM Technical Digest, page 684 (1985). The Lasky et al. process as shown in FIG. 1, comprises growing a lightly doped epitaxial layer 2 on a heavily doped substrate 4 and growing a thermal oxide 6 on the lightly doped layer 2. Thereafter, a lightly doped carrier wafer 8 is bonded to the oxide layer 6. A preferential etch is used to remove the heavily doped substrate 4 leaving the thin lightly doped epitaxial layer above the thermally growing oxide layer. The Lasky et al. process and variations thereof have not been actively integrated into commercial device manufacturing because of the difficulty in achieving thickness uniformity over the wafer surface and problems in obtaining thin layers of controlled doping profile. These problems are partly due to the wide doping gradient which characterizes the etch stop region and the stress produced at the epitaxial layer-substrate interface. The stress produces defects in a resultant thin active area. Thus, there is a need to reduce defects and improve the thickness control in the fabrication of thin silicon layers on an insulating substrate.

SUMMARY OF THE INVENTION

The present invention is directed to a method for making high quality silicon on insulator structures. The method of the present invention utilizes the advantages of thin epitaxial films produced by ultra high vacuum chemical vapor deposition (UHVCVD) to enable the formation of SOI layers without the problems previously encountered. UHVCVD is a low temperature process that allows the formation of layers with very high doping, approximately $10^{21}$ cm$^{-3}$ or greater and very steep doping profiles, approximately 1 nm per decade of a dopant concentration.

In accordance with the method of the present invention, a very heavily doped etch stop layer of silicon is formed on a lightly doped silicon substrate. A lightly doped active layer of silicon is then formed on the etch stop layer. Both the very heavily doped etch stop layer and the lightly doped active layer are formed by UHVCVD. An insulator layer is then formed on the active layer and a carrier substrate is bonded to the insulator layer either by growing a layer of polysilicon to substrate thickness or using bonding layers to attach a wafer. Therafter, the silicon substrate is removed in a first etch with the heavily doped layer acting as an etch stop during this step. Subsequently, the etch stop layer is removed in a second etch resulting in the SOI structure.

The use of UHVCVD allows the etch stop layer to be very heavily doped. In addition, UHVCVD allows the etch stop layer to be very thin due to the extreme sharpness of the gradient of the doping level in the layer. Thus, an ideal, uniform etch stop layer is provided resulting in a much improved control of the thickness of the active layer of the SOI structure.

In addition, the use of UHVCVD permits germanium to be added to the etch stop layer in order to create stress free layers by compensating for the stress that would otherwise normally occur due to the high doping levels in this layer. In turn, the stress at the interface between the heavily doped etch stop layer and the lightly doped active layer is compensated, resulting in a final active device layer which can be very thin while being dislocation free.

BRIEF DESCRIPTION OF THE DRAWINGS

FIG. 1 is a cross-sectional view of an intermediate step in the fabrication of a silicon on insulator structure in accordance with a prior art method.

FIGS. 2–7 are cross-sectional views of various steps in the method of fabrication of the silicon on insulator structures in accordance with the present invention.

FIG. 8 is a cross-sectional view showing a bonding step in the formation of the silicon on insulator structures of the present invention.

FIG. 9 is another embodiment of the bonding step in the formation of the silicon insulator structures of the present invention.

FIG. 10 is a graph showing the doping profile of the active layer formed by UHVCVD of the SOI of the present invention.

DETAILED DESCRIPTION OF THE PRESENT INVENTION

In the following description of the invention, specific p and n conductivity type materials and regions are indicated. These indications are by way of example and shall not be deemed to limit the teachings of the present invention. It will be understood that devices having opposite p and n arrangements are considered equivalent in all pertinent respects to the structures described herein. In addition, well known lithographic masking, patterning and etching steps are employed in the method of fabrication and are therefore not described in detail herein.

Turning now to FIGS. 2–7, there is shown in FIG. 2 a lightly doped substrate 10 on which is epitaxially deposited a heavily doped layer 12 by UHVCVD. The UHVCVD process used herein is described in detail by Meyerson et al., Appl. Phys. Lett., Vol. 50, No. 2, pp. 113–115 (1987), said article being incorporated herein by reference. As will be described in more detail below, the UHVCVD process employed herein permits layer 12 to be very heavily doped in the range of $10^{21}$ cm$^{-3}$ or greater and with an extremely abrupt gradient. As shown in FIG. 3, a lightly doped layer 14 of silicon is then grown by UHVCVD on layer 12. Layers 12 and 14 may be deposited as pure silicon. The UHVCVD process also permits layers to be grown with small concentrations of germanium added. In the fabrication of the SOI structures of the present invention, it is advantageous to provide layer 12 with germanium added in order to compensate for the stress normally induced by the high level of dopant introduced into layer 12. Typically, about 2% Ge is needed to compensate for the strain. In addition, active layer 14 may also be deposited with germanium added.

As shown in FIG. 4, an insulator layer 16 is then formed on the lightly doped layer 14. The insulator layer 16 may be a typical insulating material such as a silicon oxide or a silicon nitride. For example, layer 16 may be silicon dioxide deposited by plasma enhanced chemical vapor deposition (PECVD). It is important that this process be carried out at moderately low temperatures in order to avoid significant diffusion of impurities from layer 12, which would destroy the sharp doping gradient. Alternatively, all or portions of layer 16 may be thermally grown oxide. As shown in FIG. 5, a carrier wafer 18 is formed on the insulator layer 16. The carrier wafer 18 may be comprised of a layer of polysilicon deposited by PECVD. Alternatively, the carrier wafer 18 may be a separate structure that is bonded to the insulator layer 16 by any suitable bonding technique. Examples of several bonding techniques will be described hereinafter.

After the carrier wafer 18 is formed on the insulator layer 16, the structure is inverted as shown in FIG. 6 and the original substrate 10 is removed by etching, or a combination of mechanical grinding followed by etching. For greatest accuracy, the last step in this removal process should use a preferential etch solution such as KOH which will stop etching at the interface to the heavily doped layer 12. Layer 12 is an excellent etch stop because of its high doping concentration which occurs abruptly at the interface. Thereafter, as shown in FIG. 7, the etch stop layer 12 is removed using a preferential etch solution such as a mixture of HF/nitric/acetic in a ratio of 1:3:8 by volume. This solution will etch the heavily doped layer 12 with a high etch rate and thereafter will remove only a small portion of layer 14 because the lighter doped layer 14 is etched at a much slower rate. Layer 12 can be etched away cleanly and uniformly because of its sharp doping gradient. The abrupt doping profile allows layer 12 to be made very thin, so that the etch time to remove it can be made small. The underlying layer 14 is then subjected to this etch process for a short time after layer 12 is removed. This results in layer 14 having a uniform thickness and a smooth planar surface 20 so that layer 14 can be made very thin, for example on the order of 500 angstroms. The uniformity of layer 14 is much improved over that found in the Lasky et al. structure of FIG. 1 which does not have an etch stop layer between the substrate 4 and active layer 2.

As shown in FIG. 7, the resulting structure is a silicon on insulator structure comprised of active silicon layer 14 and insulator layer 16 on a carrier wafer 18. Layer 14 can then be used as a template for the deposition of subsequent epitaxial layers required in forming various devices. Examples of various structures that can be formed include lateral bipolar transistors and field effect devices. In addition, a series of thin silicon layers can also be deposited to form superlattice structures.

As mentioned above, the carrier wafer may be bonded to the oxide layer 16 by any suitable technique. One embodiment for bonding as shown in FIG. 8 is to deposit a layer of polysilicon 22 on the insulator 16 as a thin layer, approximately one mil, and to coat the polysilicon layer with a thin layer of germanium 24. The carrier wafer 18 is comprised of silicon and is also coated with a thin layer of germanium 26. The two germanium layers 24 and 26 are then placed in contact with each other and the structures are exposed to temperatures sufficient to bond the wafer 18 to the insulator 16. The temperatures must be sufficient to melt the germanium to form a weld-like bond. However, the time of exposure or the temperature must not be such as to adversely affect the doping profile of layer 12. Alternatively, the germanium layer 24 could be left out so that the germanium layer 26 could bond directly to polysilicon layer 22 by interdiffusion.

An alternative embodiment is shown in FIG. 9 in which the carrier wafer may be a glass ceramic substrate. The glass ceramic substrate should have the same expansion coefficient as silicon. Examples of such glass ceramic materials are cordierite and mullite. Bonding agents would be silicon dioxide or glass layers deposited n both surfaces by the sol-gel or spray pyrolysis techniques where particle size is small and sintering temperature is low. Sol-gel layers 28 and 30 are deposited onto the insulator layer 16 and glass ceramic substrate 18 respectively, the sol-gel layers are placed in contact and the structure is sintered causing the sol-gel to bond the substrate 18 to the insulator 16.

The UHVCVD process utilized in the method of the present invention is a low temperature process that permits very thin layers to be deposited with uniform thickness and very heavy doping, with a very sharp doping profile. For example, the heavily doped etch stop layer 12 may be deposited to a thickness of about 2,000 angstroms with an abrupt doping profile as that shown in FIG. 10 and with a doping level of $10^{21}$ cm$^{-3}$ or greater. The active lightly doped layer 14 may be deposited to a thickness of about 1,000 angstroms or less and the insulator layer 16 can be deposited to a thickness of about 10,000 angstroms. Because of the etch selectivity of the etch stop layer 12, the active silicon layer 14 may be formed to a thickness in the range of 500 to 1,000 angstroms. The UHVCVD process uses temperatures of 550° or less. The low temperature processing avoids interdiffusion of dopants which would reduce the resolution of the selective etching processes.

In addition, the UCVD process permits germanium to be added to one or both of the etch stop layer 12 and active layer 14. The addition of a small percentage of germanium to layer 12 will compensate for the stress produced normally by high doping levels. In a preferred embodiment, approximately two percent germanium is added. In turn, the stress at the interface between the etch stop layer 12 and active layer 14 is compensated resulting in a final active layer 14 which can be very thin while being dislocation free. For example, a 2,000 angstrom etch stop layer 12, containing 2% germanium and a doping level of boron about $10^{21}$ cm$^{-3}$ and an active layer 14 having a doping level of about $10^{17}$ cm$^{-3}$ and a thickness of 1,000 angstroms, the dislocation level of the active layer would be $<10^2$ and the thickness uniformity of layer 14 would be ±5%.

Various structures can be formed using epitaxial SiGe for active layer 14. The amount of germanium added to layer 14 will depend on the device application, but will typically be between 10 and 20% for most applications. In addition, layer 14 could include SiGe quantum wells in order to utilize the epitaxial layer for optical electronic structures such as waveguides and modulators. SiGe channels can also be formed in the active layer 14 to make HEMT type devices.

While the invention has been particularly shown and described with respect to illustrative and preferred embodiments thereof, it will be understood by those skilled in the art that the foregoing and other changes in form and details may be made therein without departing from the spirit and scope of the invention which should be limited only by the scope of the appended claims.

Having thus described the invention, what is claimed as new and what is desired to be secured by Letters Patent is:

1. Method of forming a silicon on insulator structure comprising the steps of:

forming an etch stop layer of silicon very heavily doped with a p or n dopant on a silicon substrate, said etch stop layer containing a percentage of germanium sufficient to compensate for stress produced by the very heavy doping concentration;

forming an active layer of lightly doped silicon on said etch stop layer;

forming an insulator layer on said active layer;

forming a carrier substrate on said insulator layer;

removing said silicon substrate; and removing said etch stop layer thereby forming a substantially dislocation free, uniform silicon active layer on said insulator layer.

2. The method of claim 1 wherein said etch stop layer is formed by epitaxially growing SiGe by UHVCVD.

3. The method of claim 1 wherein said active layer is a compound semiconductor of SiGe.

4. The method of claim 3 wherein said active layer is formed by epitaxially growing SiGe by UHVCVD.

5. The method of claim 1 wherein said active layer is formed by epitaxially growing silicon by UHVCVD.

6. The method of claim 1 wherein said insulator layer is one of a silicon oxide and a silicon nitride.

7. The method of claim 1 where said insulator layer is formed by depositing an insulator material by PECVD.

8. The method of claim 1 wherein said insulator layer is formed by thermal oxidation.

9. The method of claim 1 wherein said carrier substrate is comprised of polysilicon and said forming step includes depositing said polysilicon by PECVD.

10. The method of claim 1 wherein said step of forming a carrier substrate on said insulator layer includes bonding a carrier wafer to said insulator layer.

11. The method of claim 10 wherein said bonding step includes forming a layer of polysilicon on said insulator layer, forming a layer of germanium on said polysilicon layer, forming a layer of germanium on a silicon wafer, contacting the germanium layers and exposing said layers to temperatures sufficient to bond the carrier substrate to said insulator layer.

12. The method of claim 10 wherein said carrier wafer is a glass ceramic material.

13. The method of claim 12 wherein said bonding step includes forming a layer of SiO$_2$ on said carrier wafer and said insulator layer, contacting the SiO$_2$ layers and exposing said layers to temperatures sufficient to bond the carrier substrate to said insulator layer.

14. The method of claim 12 wherein said bonding step includes forming a layer of sol-gel on said carrier substrate and said insulator layer, contacting the sol-gel layers and exposing said layers to temperatures sufficient to bond the carrier substrate to said insulator layer.

15. The method of claim 1 wherein said etch stop layer is formed with a steep doping profile.

16. The method of claim 15 wherein said doping profile is approximately as that shown in FIG. 10.

17. The method of claim 15 wherein said doping profile is about 1 nm per decade of doping concentration.

18. The method of claim 15 wherein said etch stop layer is formed with a doping concentration level of about $10^{21}$ cm$^{-3}$ or greater.

19. The method of claim 1 wherein said etch stop layer is formed by low temperature CVD.

20. The method of claim 19 wherein said CVD is performed at 550° C. or less.

21. The method of claim 1 wherein said etch stop layer is formed to a thickness of 2,000 angstroms.

22. The method of claim 1 wherein said active layer is formed to a thickness in the range of about 500 to 1,000 angstroms.

23. The method of claim 1 wherein the percentage of germanium is in the range of 1–8%.

24. The method of claim 1 wherein the percentage of germanium is about 2%.

25. The method of claim 1 wherein said etch stop layer and said active layer are formed by low temperature CVD.

26. The method of claim 1 wherein the p dopant in said etch stop layer is boron, and wherein the concentration of germanium is higher than the concentration of boron.

27. The method of claim 26 wherein the concentration of boron is about $10^{21}$ cm$^{-3}$.

28. The method of claim 26 wherein the amount of germanium in the etch stop layer is about 2%.

29. The method of claim 1 wherein the p dopant in said etch stop layer is boron in a concentration of about $10^{21}$ cm$^{-3}$.

30. The method of claim 26 wherein said step of forming a carrier substrate on said insulator includes the steps of forming an insulator layer on a silicon carrier wafer and bonding together the insulating layers on said carrier wafer and said active layer.

31. The method of claim 30 wherein said steps of removing the silicon substrate and removing said etch stop layer are effected by chemical etching in one or more steps in which the etching solution utilized in at least one etching step is selected from the group consisting of KOH and a mixture of HF, nitric acid and acetic acid.

32. The method of claim 30 wherein both insulator layers are oxide layers.

* * * * *

UNITED STATES PATENT AND TRADEMARK OFFICE
CERTIFICATE OF CORRECTION

PATENT NO. : 5,462,883
DATED : October 31, 1995
INVENTOR(S) : Robert H. Dennard, et al.

It is certified that error appears in the above-indentified patent and that said Letters Patent is hereby corrected as shown below:

Column 4, line 21:   "n" should read --on--
    Column 4, line 45:   "UCVD" should read --UHVCVD--
    Column 4, line 59:   " $<10^2$ " should read -- $\leq 10^2$ --
    Column 5, line 56:   "claim 12" should read --claim 10--
    Column 6, line 24, Claim 22:   "claim 1" should rea --claim 21--

Signed and Sealed this

Tenth Day of September, 1996

BRUCE LEHMAN

*Attest:*

*Attesting Officer*      *Commissioner of Patents and Trademarks*